United States Patent
Ha et al.

(10) Patent No.: US 7,310,225 B2
(45) Date of Patent: Dec. 18, 2007

(54) HEAT RADIATION STRUCTURE FOR SECONDARY BATTERY MODULE, AND SWITCHING BOARD AND SECONDARY BATTERY MODULE HAVING THE SAME

(75) Inventors: Jin Woong Ha, Cheonan-si (KR); Jeeho Kim, Daejeon (KR); HanHo Lee, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 11/317,433

(22) Filed: Dec. 23, 2005

(65) Prior Publication Data

US 2006/0164812 A1    Jul. 27, 2006

(30) Foreign Application Priority Data

Dec. 24, 2004    (KR) ............... 10-2004-0112595

(51) Int. Cl.
*H05K 7/20* (2006.01)
(52) U.S. Cl. ............... 361/688; 361/690; 361/695
(58) Field of Classification Search ........... 361/719, 361/683, 688, 704, 709, 690, 695
See application file for complete search history.

(56) References Cited

U.S. PATENT DOCUMENTS

| | | | | |
|---|---|---|---|---|
| 4,557,225 A | * | 12/1985 | Sagues et al. ............ | 123/41.31 |
| 6,785,139 B2 | * | 8/2004 | Onizuka et al. ............ | 361/704 |
| 6,875,054 B2 | * | 4/2005 | Donaldson et al. ......... | 439/587 |
| 6,906,483 B2 | * | 6/2005 | Tominaga et al. .......... | 318/293 |
| 6,914,416 B2 | * | 7/2005 | Thomas et al. ............. | 320/136 |
| 7,180,739 B2 | * | 2/2007 | Kajiura ...................... | 361/695 |
| 2005/0121986 A1 | * | 6/2005 | Matsuki ...................... | 310/64 |

* cited by examiner

*Primary Examiner*—Michael C. Zarroli
(74) *Attorney, Agent, or Firm*—Cantor Colburn LLP (57) ABSTRACT

A heat dissipation structure connected to switching elements that control charge and discharge of a secondary battery module, the heat dissipation structure includes a pair of side frames to which charge-purpose switching elements and discharge-purpose switching elements are coupled, respectively, a main frame for interconnecting the side frames and a plurality of heat dissipation ribs protruding upward from the main frame while the heat dissipation ribs are arranged in parallel with each other, whereby the heat dissipation structure is constructed in a rectangular compact shape.

7 Claims, 5 Drawing Sheets

HEAT RADIATION STRUCTURE FOR SECONDARY BATTERY MODULE, AND SWITCHING BOARD AND SECONDARY BATTERY MODULE HAVING THE SAME

FIELD OF THE INVENTION

The present invention relates to a heat dissipation structure for secondary battery modules or packs and a switching board and a secondary battery module having the same, and, more particularly, to a heat dissipation structure that is capable of effectively dissipating heat generated from switching elements for controlling overcharge, overdischarge, and overcurrent of a high-output, large-capacity secondary battery module or pack having a plurality of unit cells electrically connected with each other such that the unit cells can be charged and discharged, a switching board having the heat dissipation structure and the switching elements, which are mounted on a printed circuit board, and a secondary battery module including the switching board.

BACKGROUND OF THE INVENTION

Recently, a secondary battery, which can be charged and discharged, has been widely used as an energy source for wireless mobile devices. Also, the secondary battery has attracted considerable attention as a power source for electric vehicles and hybrid electric vehicles, which have been developed to solve problems, such as air pollution, caused by existing gasoline and diesel vehicles using fossil fuel. As a result, kinds of applications using the secondary battery are being increased owing to advantages of the secondary battery, and hereafter the secondary battery is expected to be applied to more applications and products than now.

As kinds of applications and products, to which the secondary battery is applicable, are increased, kinds of batteries are also increased such that the batteries can provide outputs and capacities corresponding to the various applications and products. Furthermore, there is a strong need to reduce the sizes and weights of the batteries applied to the corresponding applications and products.

For example, small-sized mobile devices, such as mobile phones, personal digital assistants (PDAs), digital cameras, and laptop computers, use one or several small-sized, light cells for each device according to the reduction in size and weight of the corresponding products. On the other hand, medium- or large-sized devices, such as electric bicycles, electric vehicles, and hybrid electric vehicles, use a battery module (or battery pack) having a plurality of cells electrically connected with each other because high output and large capacity is necessary for the medium- or large-sized devices. The size and weight of the battery module is directly related to the receiving space and output of the corresponding medium- or large-sized device. For this reason, manufacturers are trying to manufacture small-sized, light battery modules. Furthermore, devices, which are subject to a large number of external impacts and vibrations, such as electric bicycles and electric vehicles, require stable electrical connection and physical connection between components constituting the battery module. In addition, a plurality of cells are used to accomplish high output and large capacity, and therefore, the safety of the battery module is regarded as important. Consequently, the battery module includes switching elements for controlling overcharge, overdischarge, and overcurrent and a circuit for controlling the switching elements.

Also, as there are many kinds of products using the secondary battery in medium- or large-sized device applications, as previously described, various battery modules that are capable of providing corresponding electrical capacity and output are necessary. Furthermore, when the sizes of products are different even in the same product group, the corresponding electrical capacities and outputs are also different, and therefore, it is necessary to change the design of the battery module.

The conventional medium- or large-sized secondary battery module is constructed in a structure in which a plurality of unit cells are received in a case (housing) having a predetermined size, and the unit cells are electrically connected with each other. At the inside or the outside of the case are mounted circuit elements for sensing the voltage, the current, and the temperature of the unit cells and controlling the battery. However, this structure of the battery module, especially, the elements for controlling overcharge, overdischarge, and overcurrent, have several problems.

The switching elements used to control overcharge generate a large amount of heat. For this reason, the switching elements are generally mounted at the outside of the battery module while the switching elements are connected to an additional heat dissipation structure, and therefore, it is difficult to appropriately modify the heat dissipation structure when the size of the battery module is to be increased or decreased depending upon desired electrical capacity and output. Also, the size of the heat dissipation structure is an obstacle to design of a compact battery module.

SUMMARY OF THE INVENTION

Accordingly, it is an object of the present invention to substantially obviate the above-mentioned problems of the conventional arts as well as the technical problems requested from the past.

Specifically, a primary object of the present invention is to provide a heat dissipation structure, which is connected to switching elements and the size of which can be easily increased or decreased depending upon desired electrical capacity and output.

Another primary object of the present invention is to provide a switching board having the heat dissipation structure and the switching elements mounted on a printed circuit board.

Yet another primary object of the present invention is to provide a battery module including the switching board.

In accordance with one aspect of the present invention, the above and other objects can be accomplished by the provision of a heat dissipation structure connected to switching elements that control charge and discharge of a secondary battery module, the heat dissipation structure comprising: a pair of side frames to which charge-purpose switching elements and discharge-purpose switching elements are coupled, respectively; a main frame for interconnecting the side frames; and a plurality of heat dissipation ribs protruding upward from the main frame while the heat dissipation ribs are arranged in parallel with each other, whereby the heat dissipation structure is constructed in a rectangular compact shape.

The switching elements are connected in series with the unit cells constituting the battery module for controlling current flowing in the battery. The switching elements are also connected to a protection circuit for sensing the voltage and/or the current of the battery to control the switching elements. The switching elements are not particularly restricted so long as the switching elements can control overcharge, overdischarge, and overcurrent. For example, field effect transistor (FET) elements or transistors may be used as the switching elements. Preferably, the FET elements are used as the switching elements.

The charge-purpose switching elements are switching elements for controlling the charge state of the battery, and the discharge-purpose switching elements are switching elements for controlling the discharge state of the battery. Generally, the switching elements of the battery module include the charge-purpose switching elements and the discharge-purpose switching elements.

The switching elements are connected to a control circuit for sensing the voltage and/or the current of the battery to control the switching elements. The switching elements are turned on or off according to a signal output from the control circuit. Specifically, the control circuit normally maintains the switching elements (the charge-purpose switching elements and the discharge-purpose switching elements) in the on state. When an abnormal state occurs during charging of the battery, on the other hand, the charge-purpose switching elements are turned off to interrupt the charge current. When an abnormal state occurs during discharge of the battery, the discharge-purpose switching elements are turned off to interrupt the discharge current. Also, when the voltage of the battery exceeds a predetermined maximum voltage during charging of the battery, the control circuit outputs a signal for turning the charge-purpose switching elements off to prevent overcharge of the battery. When the voltage of the battery is lowered below a predetermined minimum voltage during discharge of the battery, on the other hand, the control circuit outputs a signal for turning the discharge-purpose switching elements off to prevent overdischarge of the battery. When the output side of the battery short-circuits, and therefore, overcurrent flows in the battery, or when a high charging voltage is applied to the battery due to abnormal operation of the battery, and therefore, overcurrent flows in the battery, the control circuit senses the overcurrent flowing in the battery and outputs signals for turning the switching elements off.

The heat dissipation structure according to the present invention is a structure coupled to the above-described switching elements for dissipating heat generated from the switching elements. The charge-purpose switching elements are coupled to one of the side frames, i.e., one side frame (a), and the discharge-purpose switching elements are coupled to the other of the side frames, i.e., the other side frame (b).

The physical connection (contact) between the switching elements and the side frames allows heat dissipation due to heat transfer. The connection between the switching elements and the side frames may be accomplished in various manners. In a preferred embodiment of the present invention, the side frames have coupling grooves extending in the longitudinal direction thereof, and the switching elements are coupled to the heat dissipation structure by means of coupling members having thread parts, which are threadedly engaged in the coupling grooves. Since the coupling grooves are formed along the whole longitudinal direction of the side frames, the switching elements can be coupled to the side frames at any position.

Preferably, the main frame, the side frames, and the heat dissipation ribs, which constitute the heat dissipation structure according to the present invention, is molded in a single body. The material for the molded body is not particularly restricted so long as the material has high thermal conductivity. Preferably, the molded body is made of a material, such as aluminum or an aluminum alloy.

The heat dissipation ribs, which protrude upward from the main frame, are provided in large numbers, and arranged in parallel with each other, to accomplish effective heat dissipation. The heat dissipation ribs may be arranged in parallel with or perpendicular to the side frames. Preferably, the heat dissipation ribs are arranged in parallel with the side frames such that flow channels defined between the heat dissipation ribs are opened to the sides, by which high heat dissipation efficiency is accomplished.

Preferably, the maximum height of the heat dissipation ribs is approximately equal to that of the side frames such that the heat dissipation ribs having relative low strength are protected by the side frames.

The heat dissipation structure can be appropriately cut in the longitudinal direction thereof when designing a battery module having desired capacity and output. Consequently, the heat dissipation structure can be easily modified depending upon the change in design of the battery module.

In accordance with another aspect of the present invention, there is provided a switching board having the above-described heat dissipation structure.

The switching board according to the present invention comprises: a printed circuit board electrically connected to unit cells; switching elements mounted on the printed circuit board; and a heat dissipation structure as described above. The heat dissipation structure is connected to the switching elements while the heat dissipation structure is electrically connected to the printed circuit board.

The lower surface of the printed circuit board of the switching board may be attached to the outside of the battery module. In this case, the battery module is constructed in a compact structure while high heat dissipation efficiency is accomplished.

The coupling between the printed circuit board and the heat dissipation structure may be accomplished in various manners. In a preferred embodiment of the present invention, the side frames of the heat dissipation structure are provided at the lower ends thereof with coupling grooves, which extend in the longitudinal direction of the side frames, and the heat dissipation structure is coupled to the printed circuit board by means of coupling members having thread parts threadedly engageable in the coupling grooves.

A circuit for controlling the operation of the switching elements may be formed either on the printed circuit board or on an additional circuit member.

In accordance with yet another aspect of the present invention, there is provided a battery module including the above-described switching board. For example, the battery module comprises: a plate, on which a plurality of unit cells, which are chargeable and dischargeable secondary cells, are stacked one on another; and circuit units for controlling the operation of the battery.

The plate is not particularly restricted so long as the plate has a structure in which the unit cells can be stacked one on another. The plate may be a case having a receiving part corresponding to the size of the unit cells such that the unit cells can be easily mounted in the receiving part. Preferably, the case is constructed in a separated structure in which the upper and lower parts of the stacked unit cells are covered by the case.

In a preferred embodiment of the present invention, the battery module comprises: a plurality of unit cells, which are chargeable and dischargeable secondary cells; a rectangular lower case having a lower receiving part, to which a main board assembly is attached, and an upper receiving part, on which the unit cells are sequentially stacked one on another; a rectangular upper case having a lower receiving part for covering the upper end of the unit cells stacked on the lower case; a first circuit unit for performing the electrical connection between the stacked unit cells, the first circuit unit including a sensing board assembly for sensing the voltage, the current, and the temperature of the battery, the first circuit unit being mounted at one side surface of the battery module adjacent to the electrode terminals of the unit cells; a second circuit unit electrically connected to the first circuit unit, the second circuit unit including a main board assembly for controlling the battery module, the second circuit unit being mounted in the lower receiving part of the lower case; and a third circuit unit electrically connected to the second circuit unit, the third circuit unit having a switching board, the third circuit unit being mounted at the other side surface of the module such that the third circuit unit is located opposite to the first circuit unit.

The battery module according to the present invention has a compact structure. Specifically, the width of the completed battery module is approximately equal to or slightly greater than that of each unit cell, the length of the battery module is greater by the sum of the width of the first circuit unit and the width of the third circuit unit than that of each unit cell, and the thickness of the battery module approximately equals to the sum of the total thickness of the stacked unit cells, the thickness of the second circuit unit, and the thicknesses of the upper and lower cases. Consequently, the size of the battery module according to the present invention is less than that of any conventional battery module, and therefore, the battery module according to the present invention can be effectively mounted in external devices or apparatuses, to which the present invention is applied.

The unit cells are not particularly restricted so long as the unit cells are chargeable and dischargeable secondary cells having plate-shaped electrode terminals. For example, lithium secondary cells, nickel-metal hydride (Ni-MH) cells, or nickel-cadmium (Ni—Cd) cells may be used as the unit cells. Preferably, the lithium secondary cells are used as the unit cells, since the lithium secondary cells provide high output to weight ratio. Base on their shapes, the lithium secondary cells are classified into cylindrical cells, rectangular cells, and pouch-shaped cells. Preferably, the rectangular cells and the pouch-shaped cells, which can be stacked in high integration, are used as the unit cells. More preferably, the pouch-shaped cells, the weight of which is small, are used as the unit cells.

According to the present invention, the upper case and the lower case of the battery module are separated from each other. Consequently, when the capacity or the output of the battery module is to be changed as occasion demands, the unit cells are added or removed between the upper case and the lower case, whereby flexible design of the battery module is possible.

The total size of the upper case and the lower case approximately corresponds to that of the unit cells. Consequently, the upper receiving part of the lower case, in which the unit cells are received, and the lower receiving part of the upper case, in which the unit cells are received, correspond to the size of the main bodies of the unit cells.

The first circuit unit is mounted at the battery module adjacent to the electrode terminals of the unit cells. The first circuit unit includes: connecting terminals for connecting the unit cells in parallel or in series with each other; and the sensing board assembly for receiving and sensing voltage and current signals from the respective unit cells and sensing the temperature of the battery. The temperature may be measured by the sensing board assembly as the whole temperature of the battery.

The structure of the connecting terminals is not particularly restricted so long as the unit cells are connected in parallel or in series with each other by the connection terminals. Preferably, a safety member is connected between the connecting terminals for interrupting current when overcurrent or overheating occurs. The safety member may be a fuse, a bimetal, or a positive temperature coefficient (PTC) element.

Preferably, the sensing board assembly is a printed circuit board (PCB), which is electrically connected to the respective unit cells.

The unit cells are electrically connected to the second circuit unit mounted in the lower receiving part of the lower case via the first circuit unit. The operation of the battery is controlled by the main board assembly of the second circuit unit.

The third circuit unit, which is electrically connected to the second circuit unit, is mounted at the module such that the third circuit unit is opposite to the first circuit unit. The third circuit unit is the last element of the module, which controls overcharge, overdischarge, and overcurrent of the battery, and is connected to an external device. The overcharge, overdischarge, and overcurrent of the battery may be controlled by the switching elements included in the third circuit unit.

As described above, the circuit units, which control the operation of the battery, are connected with each other in such a manner that the circuit units surround the battery module according to the present invention, and therefore, the total size of the battery module is greatly reduced.

The battery module according to the present invention is preferably used in a medium- or large-sized battery system having high output and large capacity. The range of the high output and the large capacity is not particularly restricted.

For example, the battery module according to the present invention may be used as a power source for various applications and products, including a power source for vehicles, such as electric bicycles (e-bikes), electric motorcycles, electric vehicles, or hybrid electric vehicles. More preferably, the battery module according to the present invention is used as a power source for the electric bicycles, since the battery module is constructed in a compact structure.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF MAIN REFERENCE NUMERALS OF THE DRAWINGS

| | |
|---|---|
| 100: switching board | 200: heat dissipation structure |
| 300: FET elements | 400: PCB |
| 500: bolts | 600: secondary battery module |

DETAILED DESCRIPTION OF PREFERRED EMBODIMENTS

Now, preferred embodiments of the present invention will be described in detail with reference to the accompanying drawings. It should be noted, however, that the scope of the present invention is not limited by the illustrated embodiments.

Figure 1:
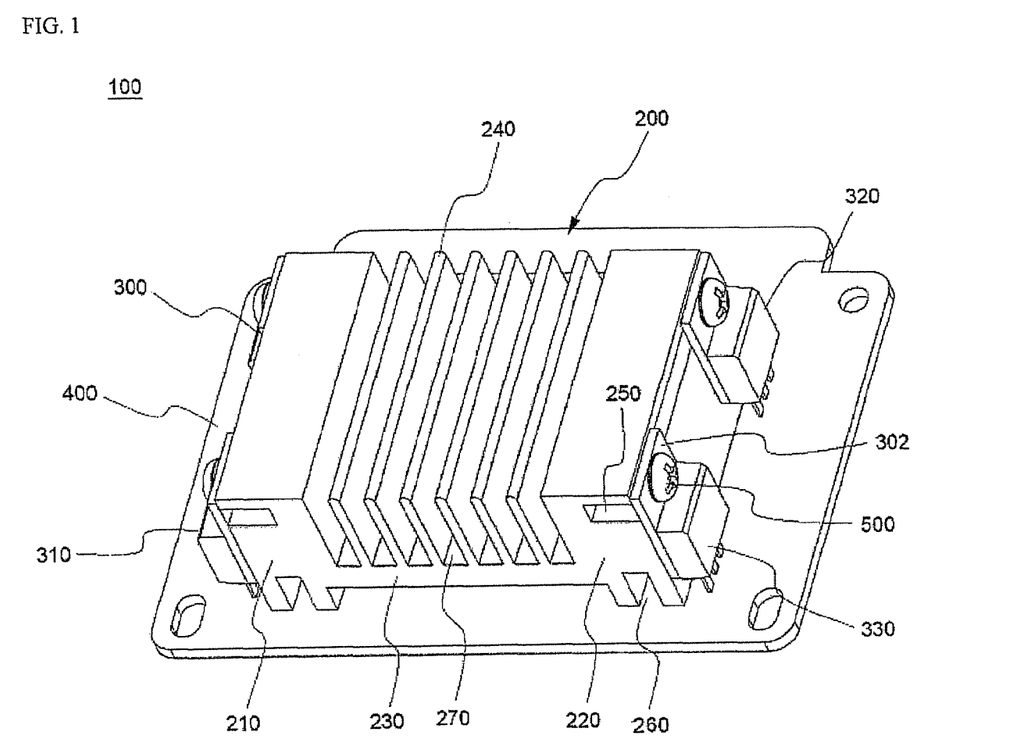
FIG. 1 is a typical perspective view illustrating a switching board according to a preferred embodiment of the present invention.
Figure 2:
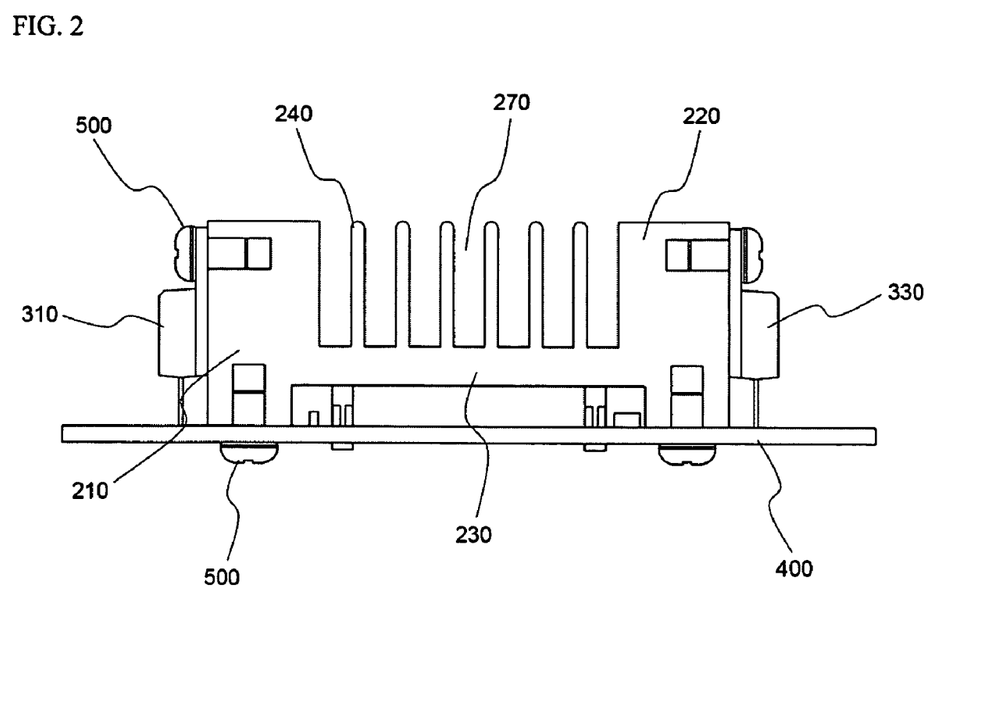
FIG. 2 is a vertical sectional view of the switching board shown in FIG. 1.
Figure 3:
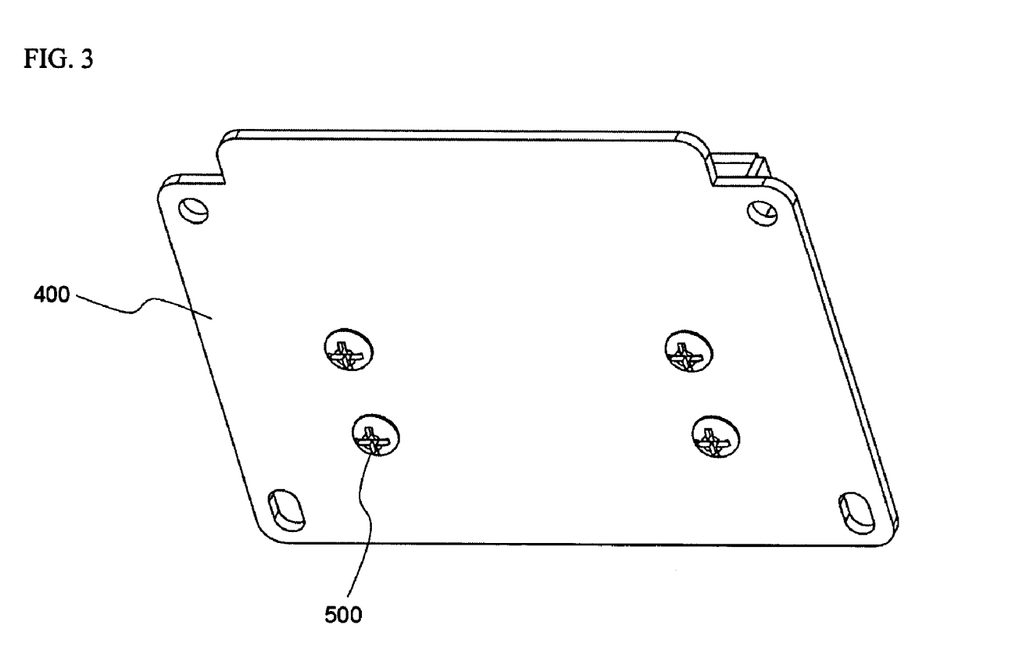
FIG. 3 is a perspective view of the switching board shown in FIG. 1 illustrating the lower part of the switching board.

FIGS. 1 to 3 typically illustrate a switching board 100 having a heat dissipation structure according to a preferred embodiment of the present invention, in a perspective view, a vertical sectional view, and a bottom view, respectively.

Referring to FIGS. 1 to 3, the switching board 100 includes a rectangular heat dissipation structure 200 mounted on a printed circuit board (PCB) 400 while the heat dissipation structure 200 is connected to four field effect transistor (FET) elements 300, 310, 320, and 330, which are switching elements.

The heat dissipation structure 200 is constructed such that the FET elements 300, 310, 320, and 330 are coupled to the opposite side frames 210 and 220, and a plurality of heat dissipation ribs 240 protrude upward from a main frame 239 for interconnecting the side frames 210 and 220.

At the outside surfaces of the side frames 210 and 220, to which the FET elements 300, 310, 320, and 330 are coupled, are formed horizontal coupling grooves 250, which extend in the longitudinal direction of the side frames 210 and 220. Coupling bolts 500 are inserted into the horizontal coupling grooves 250 of the FET elements 300, 310, 320, and 330, by which the FET elements 300, 310, 320, and 330 are coupled to the side frames 210 and 220. The horizontal coupling grooves 250 are formed along the whole longitudinal direction of the side frames 210 and 220, and therefore, the FET elements 300, 310, 320, and 330 can be coupled to the side frames 210 and 220 at any position.

At the lower ends of the side frames 210 and 220 are formed vertical coupling grooves 260, which extend in the longitudinal direction of the side frames 210 and 220, to couple the heat dissipation structure 200 to the PCB 400. Coupling bolts 500 are inserted into the vertical coupling grooves 260 through the PCB 400, by which the heat dissipation structure 200 is coupled to the PCB 400. The vertical coupling grooves 260 are formed along the whole longitudinal direction of the side frames 210 and 220, and therefore, the same effect as the horizontal coupling grooves 250 is accomplished.

When the contact area between the heat dissipation structure 200 and the PCB 400 is large, heat generated from the FET elements 300, 310, 320, and 330 is transmitted to the PCB 400 through the heat dissipation structure 200. Consequently, it is preferable to reduce the contact area between the heat dissipation structure 200 and the PCB 400. To this end, the main frame 230 is connected to the lower parts of the side frames 210 and 220 such that the main frame 230 is spaced slightly apart from the PCB 400. Also, the lower ends of the side frames 210 and 220, excluding the vertical coupling grooves 260, are in contact with the PCB 400. Consequently, the heat transfer from the heat dissipation structure 200 to the PCB 400 is minimized.

The heat dissipation ribs 240 are arranged in parallel with the side frames 210 and 220 such that flow channels 270 defined between the heat dissipation ribs 240 are opened to the sides, by which high heat dissipation efficiency is accomplished.

The FET elements 300, 310, 320, and 330 include charge-purpose switching elements 300 and 310 for controlling the charge state and discharge-purpose switching elements 320 and 330 for controlling the discharge state. When designing a battery module having higher output, additional FET elements may be mounted to the heat dissipation structure 200 at arbitrary positions.

On the PCB 400 is printed a circuit for electrically connecting the FET elements 300, 310, 320, and 330 to unit cells (not shown). A circuit for controlling the operation of the FET elements 300, 310, 320, and 330 may be formed either on the PCB 400 or on another circuit member (not shown) electrically connected to the PCB 400.

Figure 4:
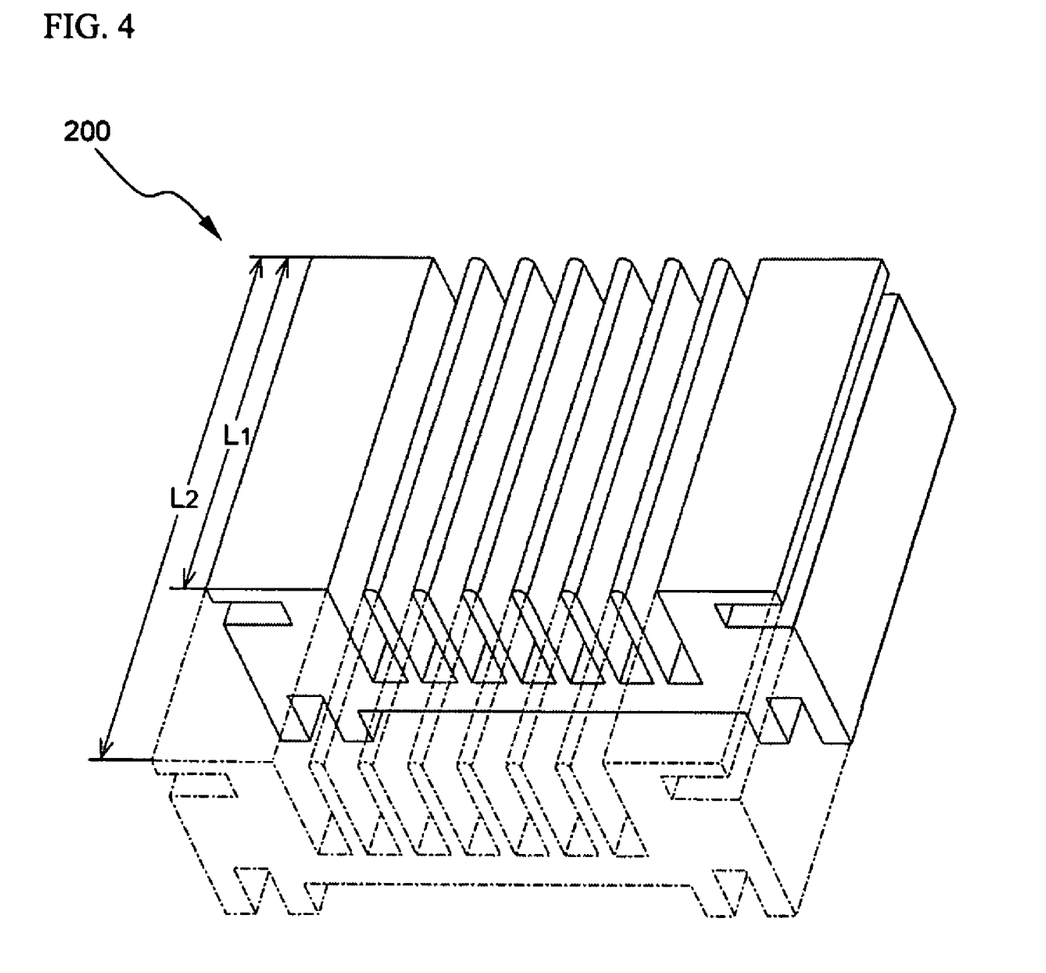
FIG. 4 is a perspective view illustrating a heat dissipation structure according to a preferred embodiment of the present invention.

Preferably, the heat dissipation structure 200 according to the present invention is formed in a single body. For example, as shown in FIG. 4, a member for the heat dissipation structure 200 may be manufactured at a length of $L_2$ in the longitudinal direction thereof, and then the member may be cut at a predetermined length $L_1$ to prepare the heat dissipation structure 200 according to the present invention. Consequently, when designing a battery module having desired capacity and output, the number of the FET elements 300 and 320 is appropriately selected, the length of the heat dissipation structure 200 is decided depending upon the selected number of the FET elements 300 and 320, and the member for the heat dissipation structure 200 is cut at the decided length.

Figure 5:
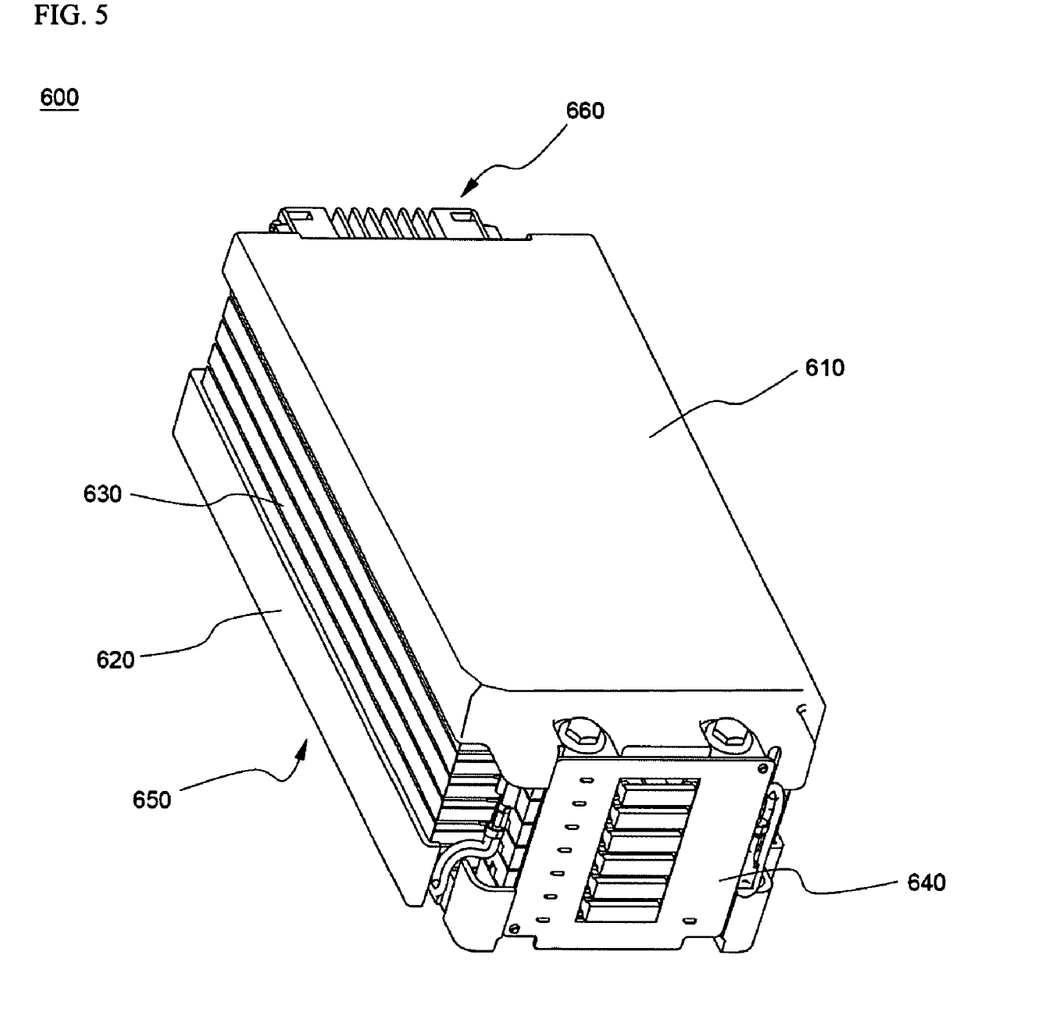
FIG. 5 is a typical perspective view illustrating a secondary battery module according to a preferred embodiment of the present invention.
Figure 6:
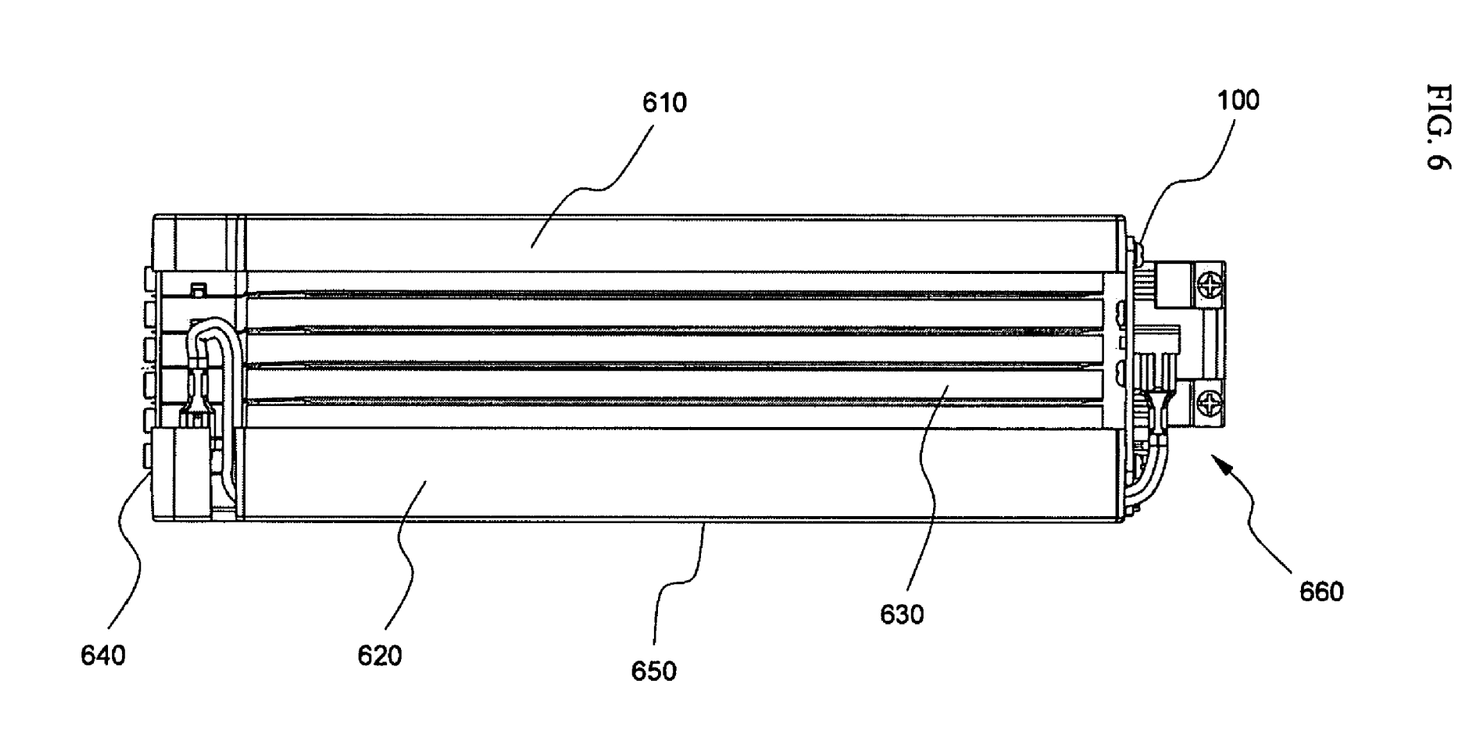
FIG. 6 is a side view of the secondary battery module shown in FIG. 5.

FIGS. 5 and 6 typically illustrate a secondary battery module including the above-described switching board according to a preferred embodiment of the present invention in a perspective view and a side view, respectively.

Referring to FIGS. 5 and 6, the battery module 600 includes an upper case 610, a lower case 620, a plurality of unit cells 630, a first circuit unit 640, a second circuit unit 650, and a third circuit unit 660. The unit cells 630 are stacked one on another between the upper case 610 and the lower case 620, which are separated from each other. The first circuit unit 640 is mounted at the front surface of the battery module 600, the second circuit unit 650 is mounted at the lower surface of the battery module 600, and the third circuit unit 660 is mounted at the rear surface of the battery module 600.

Since the upper case 610 and the lower case 620 are separated from each other, the number of the unit cells 630, which are stackable one on another, is not limited by the upper case 610 and the lower case 620. Consequently, it is possible to easily design the battery module 600, such that the battery module 600 has desired electrical capacity and output, by modifying the first circuit unit 640 and the third circuit unit 660 depending upon the number of the stacked unit cells 630. Also, the unit cells 630 are exposed, and therefore, heat dissipation is efficiently accomplished while the unit cells 630 are charged or discharged.

The first circuit unit 640 is mounted at one side surface of the battery module 600 adjacent to electrode terminals of the unit cells 630. The first circuit unit 640 includes a terminal connecting member for connecting the unit cells 630 in parallel or in series with each other and a sensing board assembly for receiving voltage and current signals from the respective unit cells 630 and sensing the temperature of the battery.

The second circuit unit 650 is electrically connected to the first circuit unit 640. The second circuit unit 650 includes a main board assembly for controlling the battery module 600. The second circuit unit 240 is mounted in a lower receiving part of the lower case 620. The second circuit unit 650 includes a circuit for controlling the operation of the switching board 100 of the third circuit unit 660.

The third circuit unit 660 is electrically connected to the second circuit unit 650. The third circuit unit 660 has the switching board 100 according to the present invention, which is connected to an external output terminal for preventing overcharge, overdischarge, and overcurrent. The third circuit unit 660 is mounted at the other side surface of the battery module 600 such that the third circuit unit 660 is located opposite to the first circuit unit 640.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As apparent from the above description, the size of the heat dissipation structure according to the present invention can be effectively increased or decreased depending upon desired electrical capacity and output. Also, the heat dissipation structure provides high heat dissipation efficiency even though the heat dissipation structure is compact. Also, the switching board including the heat dissipation structure connected to the switching elements. i.e., the FET elements, and the secondary battery module including the switching board can be easily modified depending upon the desired electrical capacity and output. Furthermore, the secondary battery module according to the present invention has a compact and stable structure. Consequently, the battery module according to the present invention can be variously utilized as a battery module for medium- or large-sized devices, such as electric bicycles, electric vehicles, and hybrid electric vehicles.

What is claimed is:

1. A high-output, large-capacity secondary battery module, the secondary battery module comprising:
    a case which is constructed in a separated structure in which upper and lower parts of stacked unit cells are covered by the case; and
    circuit units which include a switching board which controls an operation of the secondary battery module, the switching board comprising:
        a printed circuit board electrically connected to unit cells constituting the secondary battery module;
        switching elements mounted on the printed circuit board which prevent overcharge, overdischarge and overcurrent; and
        a heat dissipation structure which is connected to the switching elements while the heat dissipation structure is mounted on the printed circuit board, the heat dissipation structure comprising:
            a pair of side frames to which the switching elements are coupled, respectively;
            a main frame for interconnecting the side frames; and
            a plurality of heat dissipation ribs protruding upward from the main frame
            while the heat dissipation ribs are arranged in parallel with each other, whereby
            the heat dissipation structure is constructed in a rectangular compact shape,
        wherein the pair of side frames include coupling grooves which extend in a longitudinal direction thereof, and the switching elements are coupled to the heat dissipation structure by means of coupling members including thread parts threadedly engageable in the coupling grooves, the pair of side frames of the heat dissipation structure are also provided at lower ends thereof with the coupling grooves, which extend in the longitudinal direction of the pair of side frames, and the heat dissipation structure is coupled to the printed circuit board by means of coupling members including thread parts threadedly engageable in the coupling grooves.

2. The secondary battery module as set forth in claim 1, wherein the switching elements are field effect transistor elements.

3. The secondary battery module as set forth in claim 1, wherein the main frame, the pair of side frames and the heat dissipation ribs are molded in a single body.

4. The secondary battery module as set forth in claim 3, wherein the molded body is made of aluminum or an aluminum alloy.

5. The secondary battery module as set forth in claim 1, wherein the heat dissipation ribs are arranged in parallel with the pair of side frames.

6. The secondary battery module as set forth in claim 1, wherein the secondary battery module comprises:
    a plurality of unit cells, which are chargeable and dischargeable secondary cells;
    a rectangular lower case having a lower receiving part, to which a main board assembly is attached, and an upper receiving part, on which the unit cells are sequentially stacked one on another;
    a rectangular upper case having a lower receiving part for covering the upper end of the unit cells stacked on the lower case;
    a first circuit unit for performing the electrical connection between the stacked unit cells, the first circuit unit including a sensing board assembly for sensing the voltage, the current, and the temperature of the secondary battery module, the first circuit unit being mounted at one side surface of the secondary battery module adjacent to the electrode terminals of the unit cells;
    a second circuit unit electrically connected to the first circuit unit, the second circuit unit including a main board assembly which controls the secondary battery module, the second circuit unit being mounted in the lower receiving part of the lower case; and
    a third circuit unit electrically connected to the second circuit unit, the third circuit unit including the switching board, the third circuit unit being mounted at the other side surface of the secondary battery module such that the third circuit unit is opposite to the first circuit unit.

7. The secondary battery module as set forth in claim 6, wherein the secondary battery module further comprises:
    a circuit mounted in the second circuit part or the third circuit part which controls switching elements on the switching board.

* * * * *